United States Patent [19]
Beakes et al.

[11] Patent Number: 5,633,820
[45] Date of Patent: May 27, 1997

[54] SELF-RESETTING CMOS PARALLEL ADDER WITH A BUBBLE PIPELINED ARCHITECTURE, TRI-RAIL MERGING LOGIC, AND ENHANCED TESTABILITY

[75] Inventors: Michael P. Beakes, Yorktown Heights, N.Y.; Barbara A. Chappell; Terry I. Chappell, both of Portland, Oreg.; Bruce M. Fleischer, Mount Kisco; Thao N. Nguyen, Katonah, both of N.Y.

[73] Assignee: International Business Machines Corporation, Armonk, N.Y.

[21] Appl. No.: 463,146

[22] Filed: Jun. 5, 1995

[51] Int. Cl.⁶ .................................................. G06F 7/50
[52] U.S. Cl. .............................. 364/787; 364/780
[58] Field of Search ............................ 364/784, 786, 364/787

[56] References Cited

U.S. PATENT DOCUMENTS

| | | |
|---|---|---|
| 3,511,978 | 5/1970 | Margulius . |
| 4,161,032 | 7/1979 | Williams . |
| 4,464,728 | 8/1984 | Nash . |
| 4,651,296 | 3/1987 | Koike . |
| 4,701,877 | 10/1987 | Sahoda et al. . |
| 4,831,579 | 5/1989 | Hara et al. . |
| 4,839,849 | 6/1989 | Knauer . |
| 4,845,677 | 7/1989 | Chappell et al. . |
| 5,089,726 | 2/1992 | Chappell et al. . |
| 5,204,841 | 4/1993 | Chappell et al. . |

OTHER PUBLICATIONS

Chappell et al., "A 2-ns Cycle 3.0-ns Access 512-kb CMOS ECL SRAM with a Fully Architecture" *IEEE Journal of Solid-State Circuits* vol. 26, No. 11 Nov. 1991, pp. 1577-1585.

*Primary Examiner*—Tan V. Mai
*Attorney, Agent, or Firm*—Whitham, Curtis, Whitahm & McGinn; Stephen C. Kaufman

[57] ABSTRACT

A parallel self-resetting parallel binary adder provides high speed addition and subtraction. The adder combines the advantages of a fully custom design methodology with the higher performance potential of self-resetting complementary metal oxide semiconductor (CMOS) circuits. The adder logic architecture is carry look-ahead with two bit groups and requires six rows of merge logic to calculate the carry out of the Most Significant Bit (MSB). Loading on the critical path of the adder is reduced by moving as many merge blocks as possible to later rows. This allows the fan-out per stage in the critical path to be reduced from around three to two or less. The adder utilizes a bubble pipelined circuit architecture. For the adder, a bubble pipe segment consists of a row of self-resetting circuit blocks. A fast cycle time and minimum delay for each block is achieved by using fast forward amplification of the leading edge of the pulsed input signals followed by quick self-resetting of all nodes back to their standby state.

12 Claims, 12 Drawing Sheets

SELF-RESETTING CMOS PARALLEL ADDER WITH A BUBBLE PIPELINED ARCHITECTURE, TRI-RAIL MERGING LOGIC, AND ENHANCED TESTABILITY

BACKGROUND OF THE INVENTION

1. Field of the Invention

The present invention generally relates to parallel binary adders used in arithmetic logic units (ALUs) of microprocessors and, more particularly, to a low power, self-resetting adder with fast cycle time, minimum delay time and low latency. The parallel adder, due to its unique self-resetting design makes possible pipelined operations and good testability.

2. Background Description

Parallel binary adders are the basic building block of the arithmetic logic unit (ALU) of microprocessors, whether of the reduced instruction set computer (RISC) or complex instruction set computer (CISC) variety. The development of microprocessors is accelerating to provide greater numbers of transistors and higher numbers of millions of instructions per second (MIPS) performance, the emphasis being on improved performance and greater integration. The circuit density of modern microprocessors presents special problems, not the least of which is the increased power consumption and corresponding heat dissipation required with increased numbers of transistors on a chip. The high speed operation of the circuits comprising the microprocessors makes the circuits particularly susceptible to rate of change of current (di/dt) noise due to switching of large numbers of transistors on and off. Finally, the density of the circuits makes testing microprocessors for quality control purposes a difficult problem. There is therefore need for an improved high speed parallel adder which may be realized in integrated circuit (IC) densities required of modern microprocessors yet consumes minimum power, exhibits low noise and is readily testable.

SUMMARY OF THE INVENTION

It is therefore an object of the present invention to provide a parallel self-resetting binary adder which provides high speed addition and subtraction which uses less power.

It is another object of the invention to provide a high performance parallel adder in an integrated circuit structure which is particularly useful in microprocessors and which exhibits a fast cycle time.

It is a further object of the invention to provide a parallel adder with self-resetting for fast cycle time, minimum delay time and improved testability.

It is still another object of the invention to provide a self-resetting adder having built-in delays to provide pulsed signals having a predetermined pulse width for driving a next row of logic blocks.

According to the invention, there is provided a parallel self-resetting parallel binary adder which achieves high speed addition and subtraction while using less power and causing less di/dt noise. The high performance of the adder is achieved by combining the advantages of a fully custom design methodology with the higher performance potential of self-resetting CMOS circuits. The adder logic architecture is carry look-ahead with two bit groups and requires merge logic to calculate the carry out of the Most Significant Bit (MSB). Loading on the critical path of the adder is reduced by moving as many merge blocks as possible to later rows. This allows the fan-out per stage in the critical path to be reduced from around three to two or less. The adder utilizes a bubble pipelined circuit architecture. For the adder, a bubble pipe segment consists of a column of self-resetting circuit blocks. A fast cycle time and minimum delay for each block is achieved by using fast forward amplification of the leading edge of the pulsed input signals followed by quick self-resetting of all nodes back to their standby state. Forward amplification uses large devices in the critical path along with smaller devices for holding the standby state and for ensuring clean power-up initialization. Self-reset uses large devices which subsequently turn off before a new cycle begins. This combination of devices results in each block being responsive to only one edge of an input pulse and in each block producing a pulsed output signal.

In the preferred embodiment of the invention, there is provided a self-resetting, two's complement adder for use in a fixed-point data-flow unit of an arithmetic logic unit (ALU). As a 64-bit adder, this adder can be used for 62-bit branch address calculation, 159-bit one's complement floating point addition, 13-bit exponent difference calculation, 6-bit compare for mask generation, etc.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
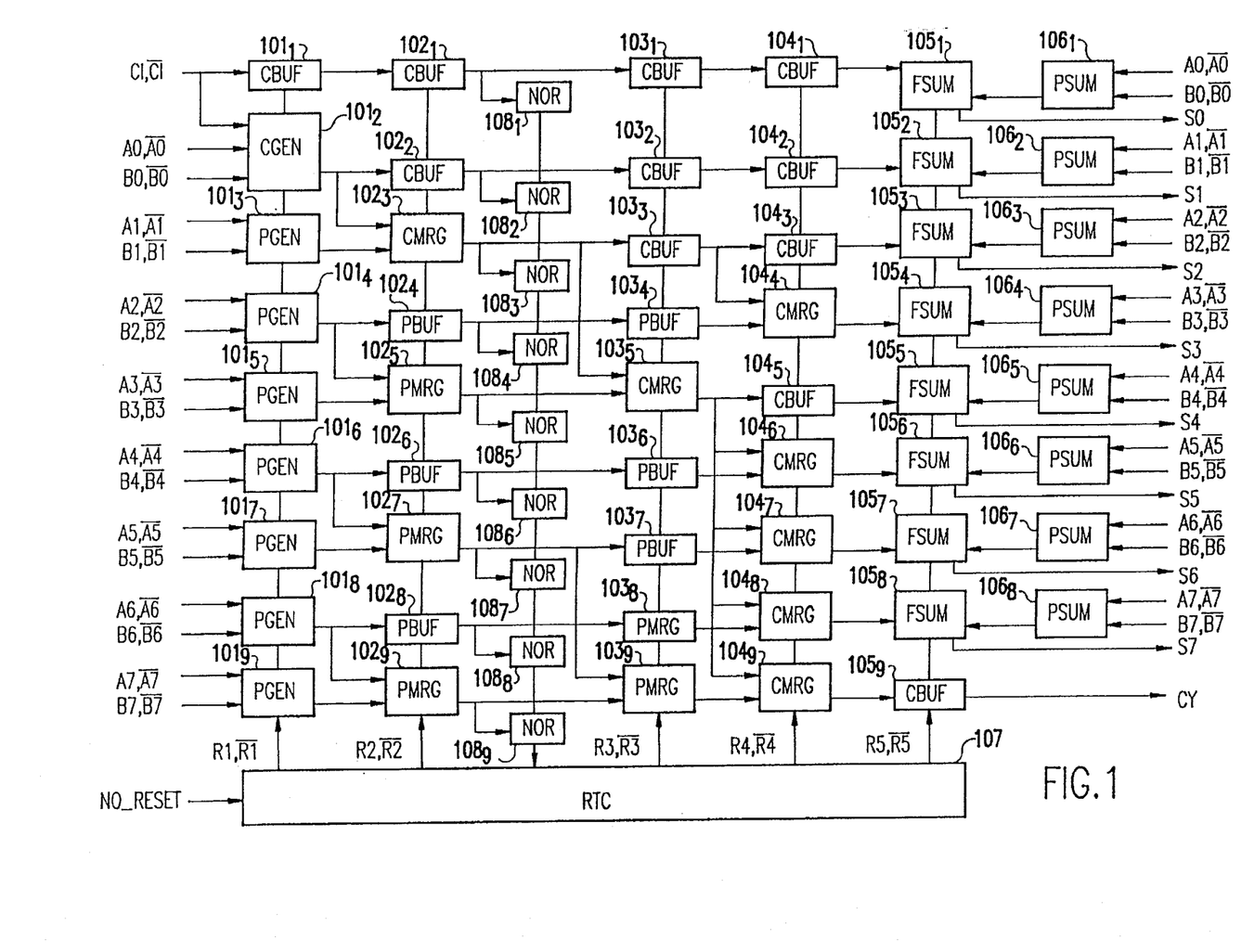
FIG. 1 is a block diagram of an exemplary 8-bit parallel binary adder for the purpose of illustrating the basic design principles of the invention.

Referring now to the drawings, and more particularly to FIG. 1, there is shown a block diagram of an exemplary 8-bit implementation of a self-resetting adder according to the teachings of the invention. In a practical implementation, the adder typically would be a 32-bit or 64-bit device, but for the purposes of explanation, the 8-bit implementation shown in FIG. 1 amply demonstrates the principles and operation of the adder, and those skilled in the art can readily extend this basic circuit to 16-bit, 32-bit and 64-bit implementations. In fact, while most practical implementations will be 32-bit and 64-bit implementations, it may become practical in ultra large scale integration (ULSI) to extend these implementations to 128-bit or larger adders.

The logic architecture for the 8-bit adder is composed of an array of self-resetting circuit elements that implement a carry look-ahead with two-way merging that computes the carry into each bit position, the carry out of the most significant bit (MSB), and the final sum, along with a column of conventional circuits for computing the partial sum (binary sum for each bit position without the carry) needed to create the final sum result.

The adder is composed of several basic building blocks implemented in CMOS circuits, each of which will be described in more detail herein below. The self-resetting section of the adder consists of a carry buffer circuit (CBUF), a carry generator circuit (CGEN), a propagate/generate/zero (PGZ) generator circuit (PGEN), a PGZ buffer circuit (PBUF), a PGZ merge circuit (PMRG), a carry merge circuit (CMRG), and a final sum circuit (FSUM). The partial sum is generated by a column of partial sum circuits (PSUM). In addition to these basic building blocks, the adder comprises a feedback reset chain that includes as its building blocks a NOR circuit and a reset timing chain circuit (RTC).

The 8-bit self-resetting parallel binary adder, as generally shown in FIG. 1, comprises an array of self-resetting complementary metal oxide semiconductor (CMOS) circuits arranged in six columns of evaluation logic and one column of reset logic. The first column of evaluation logic comprises a carry buffer circuit (CBUF) $101_1$, a three-input carry generator (CGEN) circuit $101_2$, and propagate, generate and zero (PGZ) generator (PGEN) circuits $101_3$ to $101_9$ receiving first and second binary inputs, denoted as $A_0$ to $A_7$ and $B_0$ to $B_7$, and the carry input, $C_I$. The inputs are dual-rail; that is, both true and complement inputs are provided.

The intermediate columns of the evaluation logic comprise buffer circuits and merge logic circuits, with the buffer circuits being inserted in the evaluation paths to maintain synchronization of pulses propagating in the adder bubble pipelined circuit logic architecture. More particularly, the second column comprises carry buffer circuits (CBUF) $102_1$ and $102_2$ respectively connected in series with the CBUF circuit $101_1$ and the CGEN circuit $101_2$. A carry merge circuit (CMRG) $102_3$ is connected to the CGEN circuit $101_2$ and the PGEN circuit $101_3$, and PGZ buffer (PBUF) circuits $102_4$, $102_6$ and $102_8$ and PGZ merge circuit (PMRG) $102_5$, $102_7$ and $102_9$ are alternately connected to PGEN circuits $102_4$ to $102_9$. The PGZ merge (PMRG) circuits $102_5$, $102_7$ and $102_9$ also respectively receive inputs from PGEN circuits $102_4$, $102_6$ and $102_8$.

The third column of evaluation logic comprises carry buffer circuits (CBUF) $103_1$, $103_2$ and $103_3$ respectively connected to CBUF circuits $102_1$ and $102_2$ and carry merge circuit (CMRG) $102_3$. The PBUF circuits $103_4$, $103_6$, and $103_7$, and PMRG circuit $103_8$ are respectively connected to PBUF circuits $102_4$ and $102_6$, PMRG circuit $102_7$, and PBUF circuit $102_8$. The CMRG circuit $103_5$ receives inputs from CMRG circuit $102_3$ and PMRG circuit $102_5$, and PMRG circuit $103_9$ receives inputs from PMRG circuits $102_7$ and $102_9$.

The fourth column comprises CBUF circuits $104_1$, $104_2$ and $104_3$ respectively connected to CBUF circuits $103_1$, $103_2$ and $103_3$. CMRG circuits $104_4$ and $104_6$ to $104_9$ are respectively connected to PBUF circuits $103_4$ and $103_6$ to $103_7$ and PMRG circuits $103_8$ and $103_9$. CBUF circuit $104_5$ is connected to the CMRG circuit $103_5$. CMRG circuit $104_4$ additionally receives an input from CBUF circuit $103_3$. CMRG circuits $104_6$ to $104_9$ also respectively receive inputs from CMRG circuit $103_5$.

These intermediate columns of evaluation logic are followed by a column of final sum circuits (FSUM) $105_1$ to $105_8$ and a CBUF circuit $105_7$ and a column of partial sum circuits (PSI/M) $106_1$ to $106_8$. The FSUM circuits are respectively connected to CBUF circuits $104_1$, $104_2$ and $104_3$, CMRG circuit $104_4$, CBUF circuit $104_5$, and CMRG circuits $104_6$ to $104_8$. The CBUF circuit $105_9$ is connected to the CMRG circuit $104_9$. The FSUM circuits also receive inputs from the PSUM circuits. These, in turn, receive the first and second binary inputs, denoted as $A_0$ to $A_7$ and $B_0$ to $B_7$, and their complements. The column of PSUM circuits compute the partial sum (binary sum for each bit position without the carry) connected to the self-resetting FSUM circuit elements that combines the carry bits with the partial sum bits to produce the final sum. The final sum outputs, denoted as $S_0$ to $S_7$, are output from the FSUM circuits $105_1$ to $105_8$, respectively, while the carry output, denoted CO, is output from CBUF $105_9$.

The logic architecture for the 8-bit adder was modified to improve performance by reducing the loading on the critical path through the two-way merging section of the adder. This was accomplished by moving as many merge blocks as possible to later columns allowing the fan-out per stage in the critical path to be reduced. This is demonstrated in the 8-bit implementation of the adder shown in FIG. 1 where the CMRG block $104_4$ that produces the carry into bit position 3 was moved from column 3 to column 4 to reduce the loading on the output of the CMRG block $102_3$ for bit position 2 from a fan-out of three to a fan-out of two. Applying this technique to reduce the loading on the critical path will yield a greater advantage in implementations of this adder that use more than 8-bits.

The adder utilizes a bubble pipelined circuit architecture. Bubble pipelining is like wave pipelining, but instead of propagating a single transition at a time through the circuitry, a fully formed pulse or data bubble is propagated. For the adder, a bubble pipeline segment consists of a column of self-resetting circuit elements. A fast cycle time and minimum delay for each block is achieved by using fast forward amplification of the leading edge of the pulsed input signals followed by quick self-resetting of all nodes back to their standby state. Forward amplification uses large devices in the critical path along with smaller devices for holding the standby state and for ensuring clean power-up initialization. Self-reset uses large devices which subsequently turn off before a new cycle begins. This combination of devices results in each block being responsive to only one edge of an input pulse and in each block producing a pulsed output.

Figure 2:
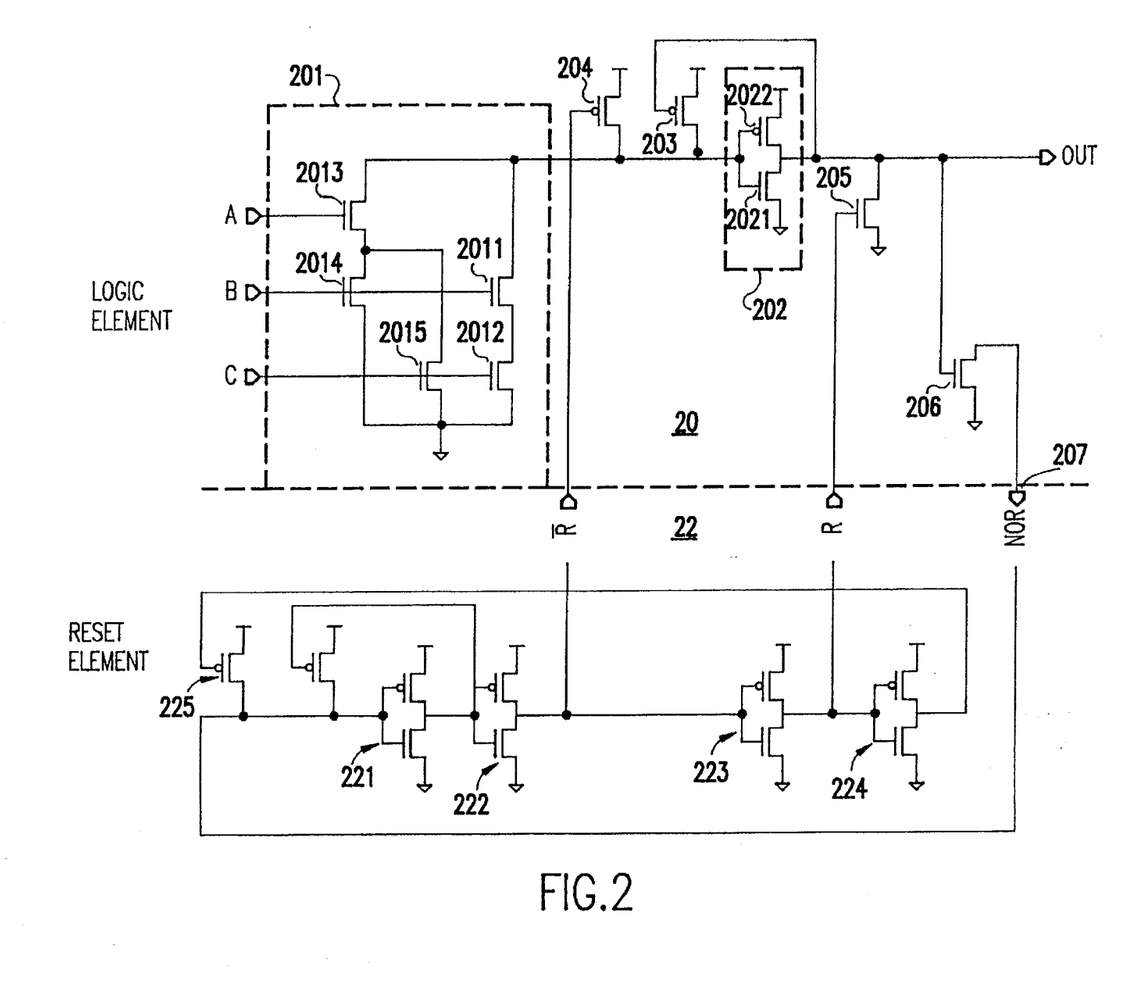
FIG. 2 is a schematic diagram of a generic form of the self-resetting logic implemented by the invention.

The generic form of the self-resetting circuit element used in the adder is shown in FIG. 2. This element can be further subdivided into a logic element 20 and a reset element 22. This division allows multiple logic elements to share a common reset element. Having a common reset element enables the trailing edge of pulses to be synchronized in each column of the array.

A logic element 20 is implemented as a logic tree 201 followed by an output inverter 202 comprising an n-channel device 2021 and a p-channel device 2022 having common gate and drain connections. The logic tree is a parallel/serial network of n-channel devices between ground and the input of the output inverter. For example, the n-channel devices 2011 and 2012 which receive inputs B and C perform an AND logic function B·C. The n-channel devices 2013, 2014 and 2015 receiving inputs A, B and C perform the logic function A·(B+C). It will be understood that this logic tree is merely exemplary. The logic tree will take different forms in each of the several building blocks, as described below.

The output inverter 202 provides both gain and the rising output signal needed to drive subsequent logic elements. A half-latch, which consists of a p-channel device 203 with the gate connected to the output of the inverter and drain connected to the top of the n-channel logic tree 201 is used to improve the standby noise margin of a logic element. The strength of the half-latch is tuned to be one tenth the strength of the top device(s) in the n-channel logic tree.

The logic element also includes two devices, a p-channel device 204 and an n-channel device 205, respectively connected to the reset signals $\overline{R}$ and R. The $\overline{R}$ reset signal connects to the gate of p-channel device 204 whose drain is connected to the top of the n-channel logic tree 201. The R reset signal is connected to the gate of n-channel device 205 whose drain is connected to the output inverter 202. The output of the inverter 202 is also connected to the gate of n-channel device 206 which constitutes one input of a NOR gate, the output of which is NOR node 207.

The generic self-resetting circuit element shown in FIG. 2 has three distinct states of operation; idle, evaluation, and reset. The idle state is achieved when power is first applied to the circuit or after the circuit has reset. This idle state is defined by all nodes in the circuit being in their inactive state. This includes the logic inputs (A, B, C) being low, the top of the logic tree (the output inverter's input) being high, the output being low, the NOR node 207 being high, and the two reset signals, $\overline{R}$ and R, being high and low, respectively. This idle state is supported by the half-latch consisting of the output inverter 202 which drives the p-channel device 203.

The evaluation state starts when a combination of active high inputs creates a conduction path between ground and the top of the logic tree through the n-channel devices in the logic tree. This forces the top of the logic tree to its active low state and switches the output inverter to create an active high output. The active high output causes the NOR node 207 to switch to its active low state which triggers the start of the reset timing chain 22. This causes the first inverter 221 in the timing chain to switch its output high which then causes the second inverter 222 to switch its output, the $\overline{R}$ reset signal, to its active low state followed by the next inverter 223 switching the R reset signal to its active high state.

The reset state starts with the two reset signals, $\overline{R}$ and R, going active and the inputs of the logic tree returning to their inactive low state. This allows the $\overline{R}$ reset signal connected to the gate of p-channel device 204 to return the top of the logic tree to its inactive high state and the R reset signal connected to the gate of n-channel device 205 to return the output of the inverter 202 to its inactive low state. At the same time, the last inverter 224 in the timing chain drives a p-channel device 225 that triggers the timing chain to return to its inactive state by returning the NOR line to its inactive high state. Once all the nodes in the logic element and the reset element become inactive, the idle state is achieved allowing the process of evaluation, reset, and idle to repeat.

In the 8-bit adder shown in FIG. 1, the self-reset portion of these circuit elements is supported by a reset timing chain (RTC) 107 and the NOR gates $108_1$ to $108_9$. This logic forms a bubble pipe segment of self-resetting circuits allowing a fast cycle time and minimum delay for each block by using fast forward amplification of a leading edge of pulsed input signals followed by quick self-resetting of all nodes back to their standby state.

This circuit implementation achieves sub-nanosecond nominal performance in CMOS technology, has no standby power, provides clean power-up initialization, has no charge redistribution problems, allows easy tuning of the circuit noise margin, and spreads the reset current over five separate time intervals.

A logic element, as illustrated in FIG. 2, performs a single-rail function by producing an output pulse when the inputs to the logic tree activate a set of transistors in the logic tree to connect the input of the logic element's output inverter to ground. In the case when true and complement signals must be generated, two logic elements are required to produce dual-rail signals where one logic element produces the true signal and the other produces the complement signal. This adder also uses tri-rail logic using three logic elements to represent the three possible states propagate carry (P), generate carry (G), or zero carry (Z) internal to the adder.

The following table describes all the self-resetting circuit element types used in the adder. All of these circuits are identical in structure with the exception of the function implemented in the logic tree. These elements are arranged in an array as shown in FIG. 1 to produce the carry into each bit position and the final sum.

| Circuit Type | FIG. No. | Logic Function |
| --- | --- | --- |
| CBUF | 3 | $CY = CI$ <br> $\overline{CY} = \overline{CI}$ |
| CGEN | 4 | $CY = A \cdot B + A \cdot CI + B \cdot CI$ <br> $\overline{CY} = \overline{A} \cdot \overline{B} + \overline{A} \cdot \overline{CI} + \overline{B} \cdot \overline{CI}$ |
| PGEN | 5 | $P = A \cdot \overline{B} + \overline{A} \cdot B$ <br> $G = A \cdot B$ <br> $Z = \overline{A} \cdot \overline{B}$ |
| PBUF | 6 | $P = PI$ <br> $G = GI$ <br> $Z = ZI$ |
| PMRG | 7 | $P = P_0 \cdot P_1$ <br> $G = G_0 \cdot P_1 + G_1$ <br> $Z = Z_0 \cdot P_1 + Z_1$ |
| CMRG | 8 | $CY = P \cdot CI + G$ <br> $\overline{CY} = P \cdot \overline{CI} + Z$ |
| FSUM | 9 | $S = PS \cdot \overline{CY} + \overline{PS} \cdot CY$ <br> $\overline{S} = PS \cdot CY + \overline{PS} \cdot \overline{CY}$ |

Figure 3:
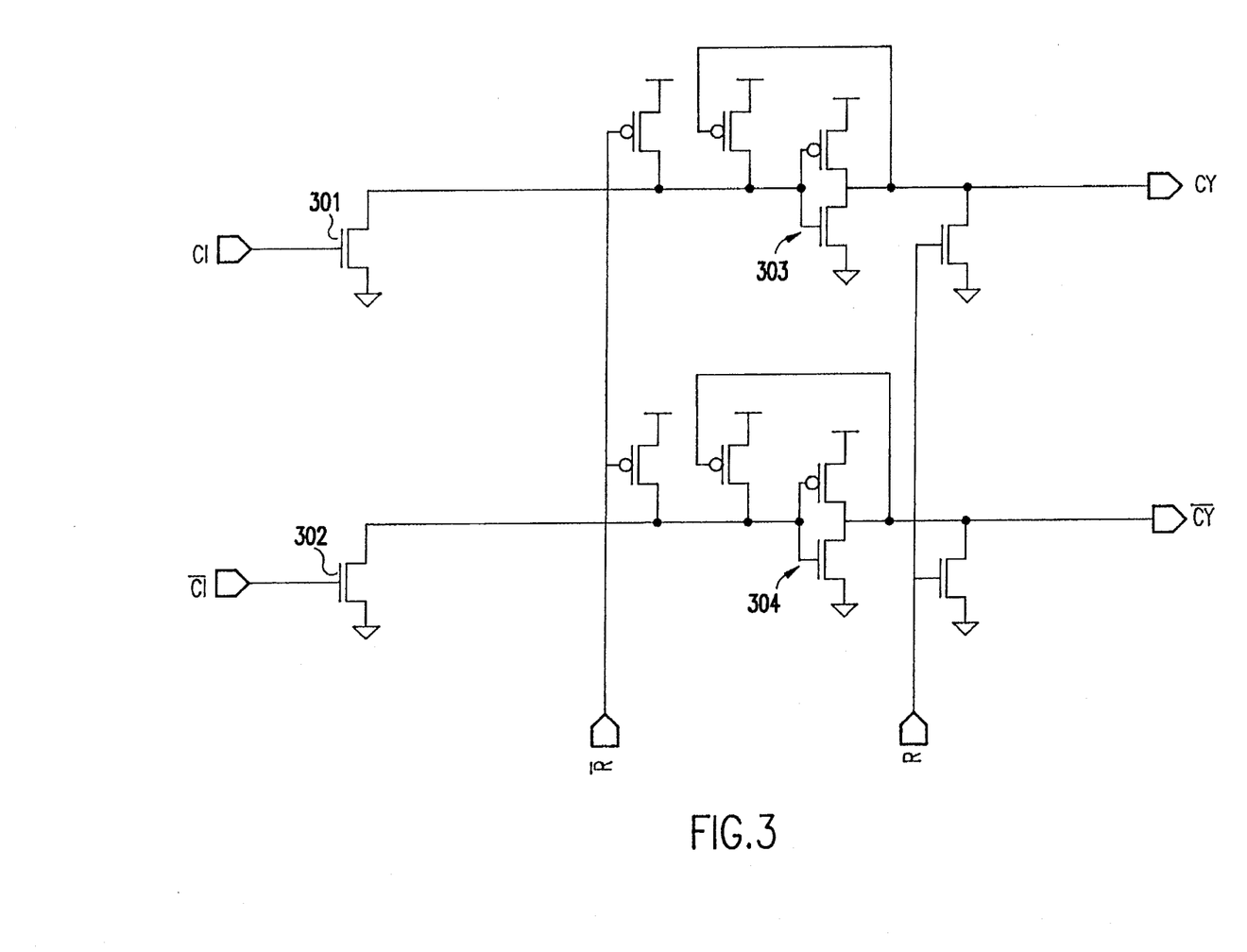
FIG. 3 is a schematic diagram of the carry buffer (CBUF) circuit used in the adder of FIG. 1.

FIG. 3 is a schematic diagram of the carry buffer circuit (CBUF) used in the adder of FIG. 1. This circuit has two complementary inputs, CI and $\overline{CI}$, respectively, and two complementary outputs, CY and $\overline{CY}$, respectively. The inputs are respectively connected to the gates of n-channel devices 301 and 302. Each of the outputs are driven by a pair of inverter drivers, 303 and 304, respectively.

Figure 4:
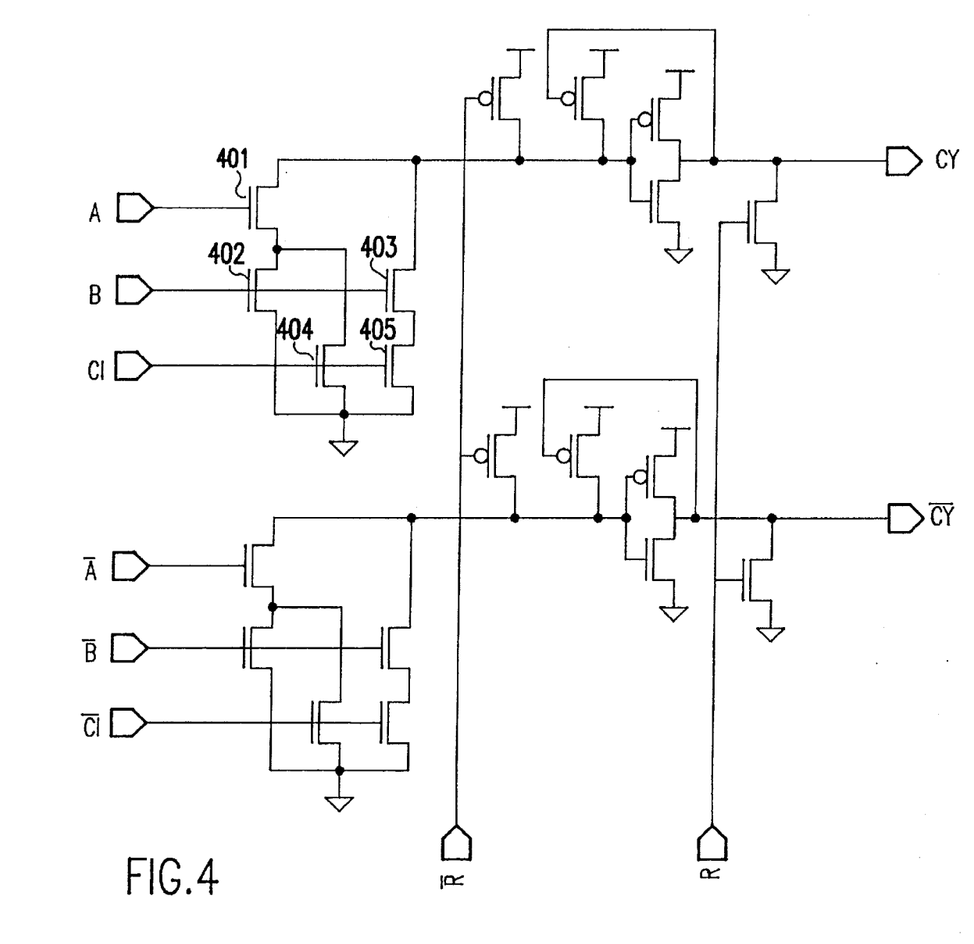
FIG. 4 is a schematic diagram of the carry generate (CGEN) circuit used in the adder of FIG. 1.

FIG. 4 is a schematic diagram of the carry generator circuit (CGEN) used in the adder of FIG. 1. This circuit has a first circuit with three inputs CI, for carry in, A, for operand A in, and B, for operand B in, and one output CY. A second circuit also has three inputs, these being the complements of the inputs to the first circuit, $\overline{CI}$, $\overline{A}$ and $\overline{B}$. The two circuits are identical, and therefore only the first will be described in detail. Input A is connected to the gate of n-channel device 401, input B is connected to the gates of n-channel devices 402 and 403, and input CI is connected to the gates of n-channel devices 404 and 405. The devices 402 and 404 are connected in parallel with their drains connected to the source of device 401. The devices 403 and 405 are connected in series, and the drains of devices 401 and 403 are connected to a common node, which is the top of the logic tree. This node is, in turn, connected to the output inverter, as described with respect to FIG. 2. Thus, it will be appreciated that the carry output CY is generated according to the Boolean logic function $$CY = A \cdot B + A \cdot CI + B \cdot CI,$$

as indicated in the table above. There are in addition two complementary inputs for the self-resetting feature of the adder as described with reference to FIG. 2.

A novel circuit scheme which calculates the propagate (only one "1"), generate (both "1"), or zero (both "0") of a 2-bit group reduces the merge logic power by one half and the transistor count by 25% compared to a conventional CMOS implementation. The circuit schematic shown in FIG. 5 illustrates the basic components of this circuit.

Figure 5:
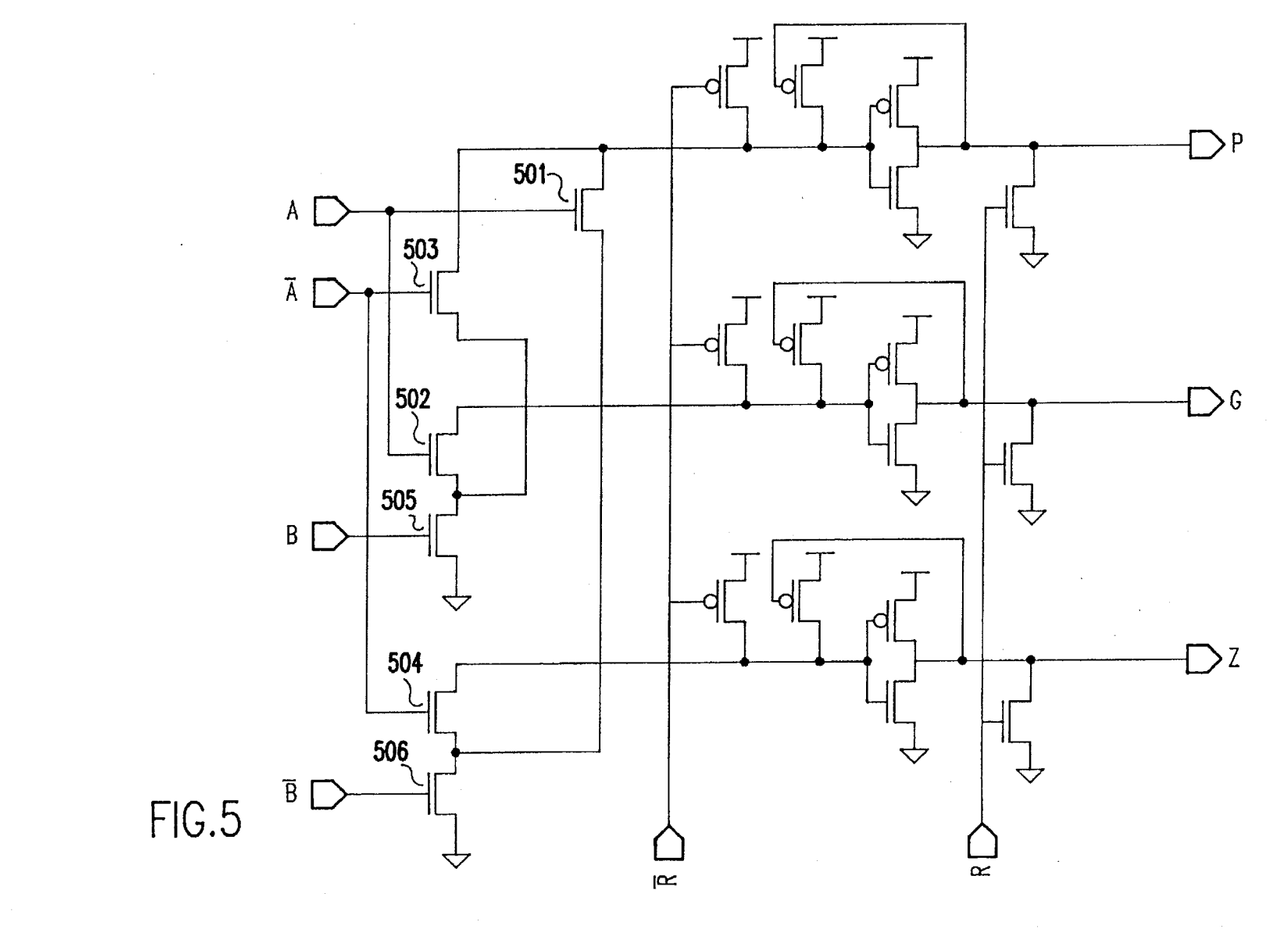
FIG. 5 is a schematic diagram of the propagate, generate and zero (PGZ) generate (PGEN) circuit used in the adder of FIG. 1.

FIG. 5 is a schematic diagram of the propagate, generate and zero circuit (PGEN) used in the adder of FIG. 1. This circuit has four inputs, A, $\overline{A}$, B, and $\overline{B}$, and three outputs, P, G and Z. The input A is connected to the gates of n-channel devices 501 and 502, and the input $\overline{A}$ is connected to the gates of n-channel devices 503 and 504. The input B is connected to the gate of n-channel device 505, and the input $\overline{B}$ is connected to the gate of n-channel device 506. The sources of devices 502 and 503 are connected to the drain of device 505, and the sources of devices 501 and 504 are connected to the drain of device 506. The common node of the drains of devices 501 and 503 is connected to a first output inverter which drives the output P. The drain of device 502 is connected to a second output inverter which drives the output G. The drain of device 504 is connected to a third output inverter which drives the output Z. Thus, the output P is generated according to the Boolean logic function $$P = A \cdot \overline{B} + \overline{A} \cdot B,$$

the output G is generated according to the Boolean logic function $$G = A \cdot B,$$

and the output Z is generated according to the Boolean logic function $$Z = \overline{A} \cdot \overline{B},$$

as indicated in the table above.

Figure 6:
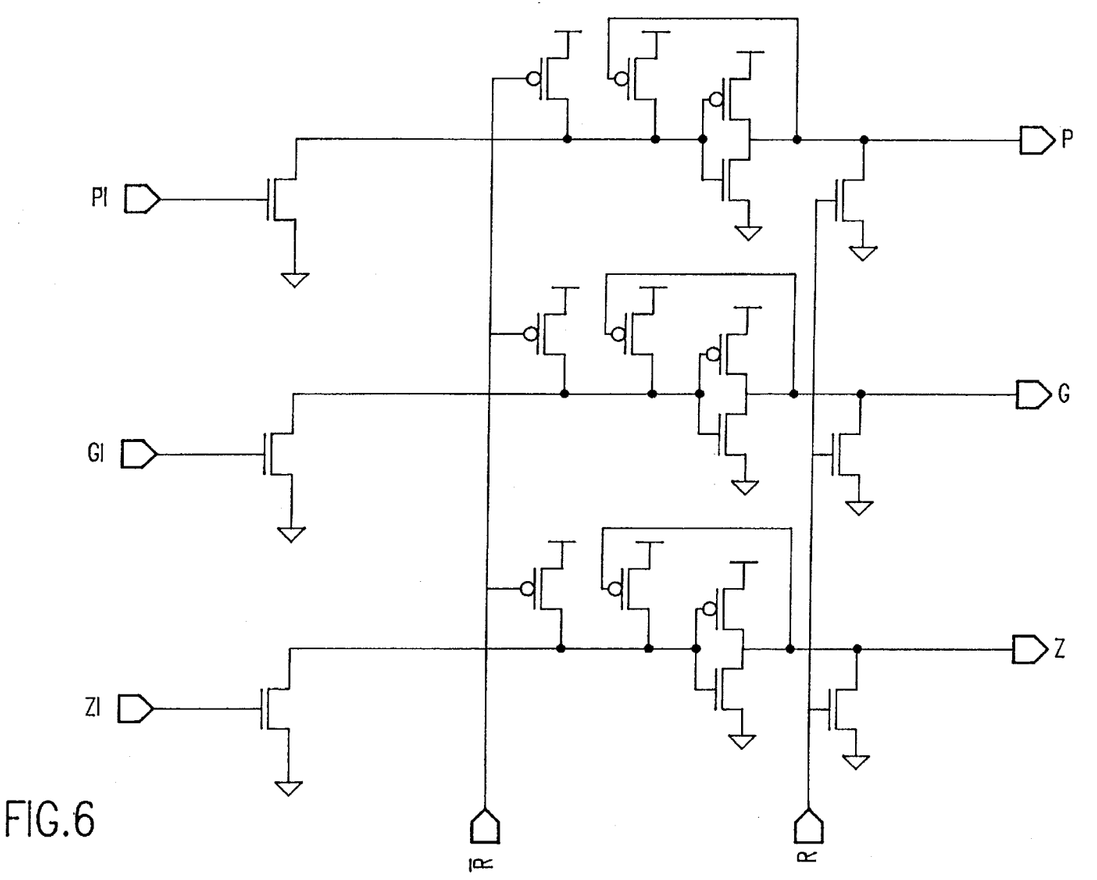
FIG. 6 is a schematic diagram of the PGZ buffer (PBUF) circuit used in the adder of FIG. 1.

FIG. 6 is a schematic diagram of the PGZ buffer (PBUF) circuit used in the adder of FIG. 1. This circuit is essentially identical to that of the carry buffer circuit (CBUF) of FIG. 3 except that there are three inputs and three outputs instead of two inputs and two outputs as in the circuit of FIG. 3. In the buffer shown in FIG. 6, the inputs are PI, GI and ZI, for propagate in, generate in and zero in, and the outputs are P, G and Z.

Figure 7:
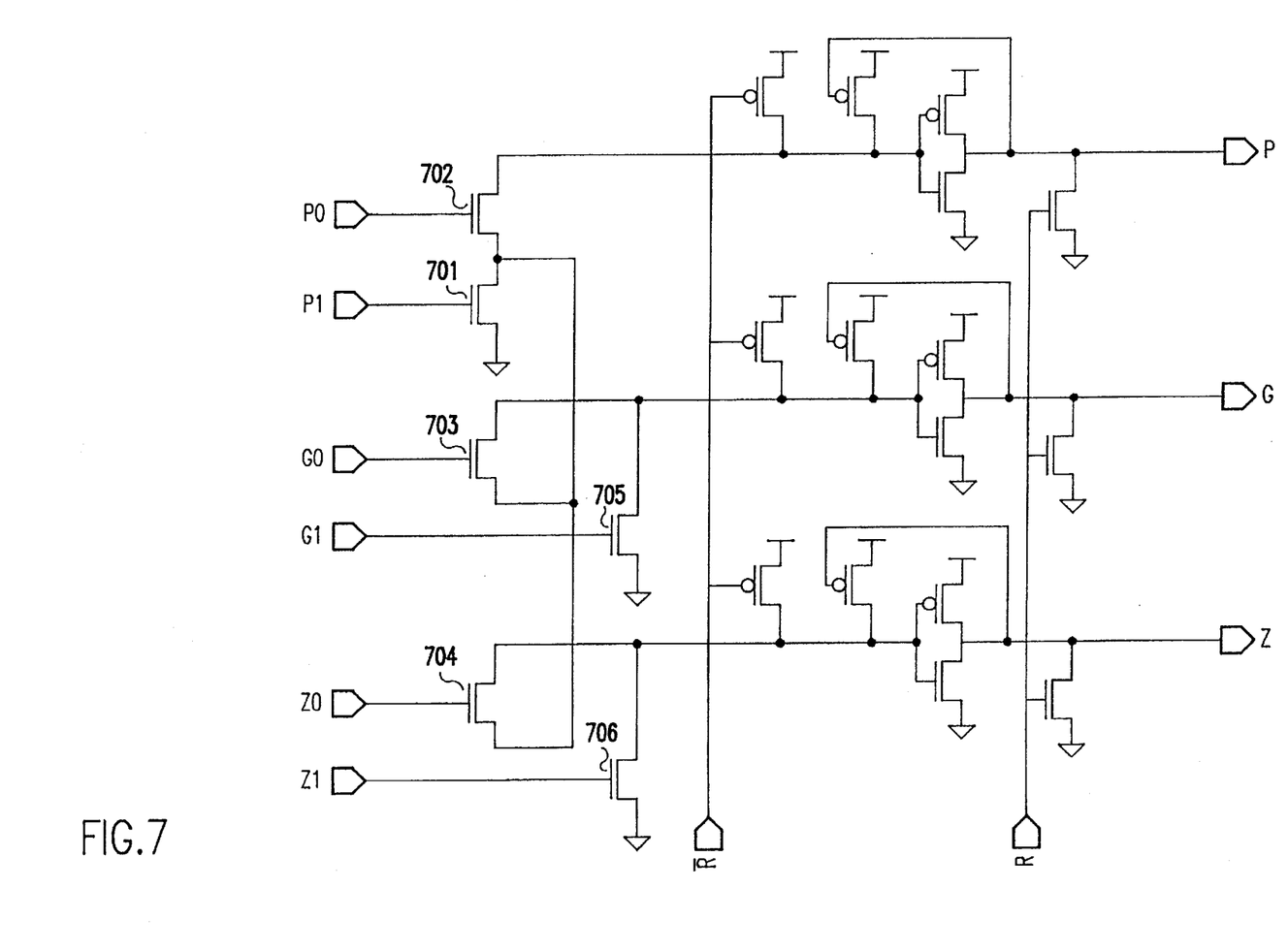
FIG. 7 is a schematic diagram of the PGZ merge (PMRG) circuit used in the adder of FIG. 1.

FIG. 7 is a schematic diagram of the PGZ merge circuit (PMRG) used in the adder of FIG. 1. The inputs, $P_1$, $G_1$ and $Z_1$ are input from a propagate, generate and carry circuit in the same row, while the inputs $P_0$, $G_0$ and $Z_0$ are input from a propagate, generate and carry circuit in the next preceding row. The input $P_1$ is connected to the gate of n-channel device 701 having its drain connected to the sources of n-channel devices 702, 703 and 704. The inputs $P_0$, $G_0$ and $Z_0$ are respectively connected to the gates of devices 702, 703 and 704, respectively. The input $G_1$ is connected to the gate of n-channel device 705 having its drain connected to a common node with the drain of device 703, and the input $Z_1$ is connected to the gate of n-channel device 706 having its drain connected to a common node with the drain of device 704. The drain of device 702 is connected a first output inverter which drives the output P. The node of the common connection of the drains of devices 703 and 705 is connected to a second output inverter which drives the output G. The node of the common connection of the drains of devices 704 and 706 is connected to a third output inverter which drives the output Z. Thus, the output P is generated according to the Boolean logic function $$P = P_0 \cdot P_1,$$

the output G is generated according to the Boolean logic function $$G = G_0 \cdot P_1 + G_1,$$

and the output Z is generated according to the Boolean logic function $$Z = Z_0 \cdot P_1 + Z_1,$$

as set out in the table above.

This circuit combines the orthogonal $P_0/G_0/Z_0$ input signals coming from the merge tree to the left with the orthogonal $P_1/G_1/Z_1$ input signals coming from the merge tree below to generate the orthogonal P/G/Z output signals which flow into the final carry block above. In standby, all these signals are low, $\overline{R}$ is high, and R is low and so this circuit has no standby power. As long as the $P_0/G_0/Z_0$ and $P_1/G_1/Z_1$ inputs are in their low standby state, all internal nodes and outputs will be initialized to their correct standby state. During evaluation, one of the $P_0/G_0/Z_0$ signals and one of the $P_1/G_1/Z_1$ signals become active high. This causes one of the three n-channel logic trees to conduct enough current to overcome one of the p-channel half-latches and, if the $P_1$ input is active, and pull one of the tree output nodes low. As a consequence, one of the output nodes (P, G, or Z, respectively) is pulled high which turns off the p-channel half-latch. Thus, about one third of the circuitry is activated during any one evaluation. The rising output signal propagates through subsequent rows of circuit blocks to contribute to the final output sum of the adder and also activates the reset circuitry (as explained in the floor plan section above). The sizes of the n-channel and p-channel devices can be tuned to set the circuit noise margin.

After evaluation and after the inputs from the previous row have returned to their low standby state, the $\overline{R}$ reset signal from the reset circuitry falls and the low tree output node is rapidly returned to its high standby state by one of the p-channel reset devices, and, if the $P_1$ input had been active the internal node is returned to its VDD-Vth standby state. Subsequently, the reset signal R rises and the high output node (P, G or Z) is reset low by one of the n-channel output devices and by one of the n-channel reset devices. Finally, the $\overline{R}/R$ reset signals from the reset circuitry return to their high/low standby state, and the circuit resumes its standby state.

Figure 8:
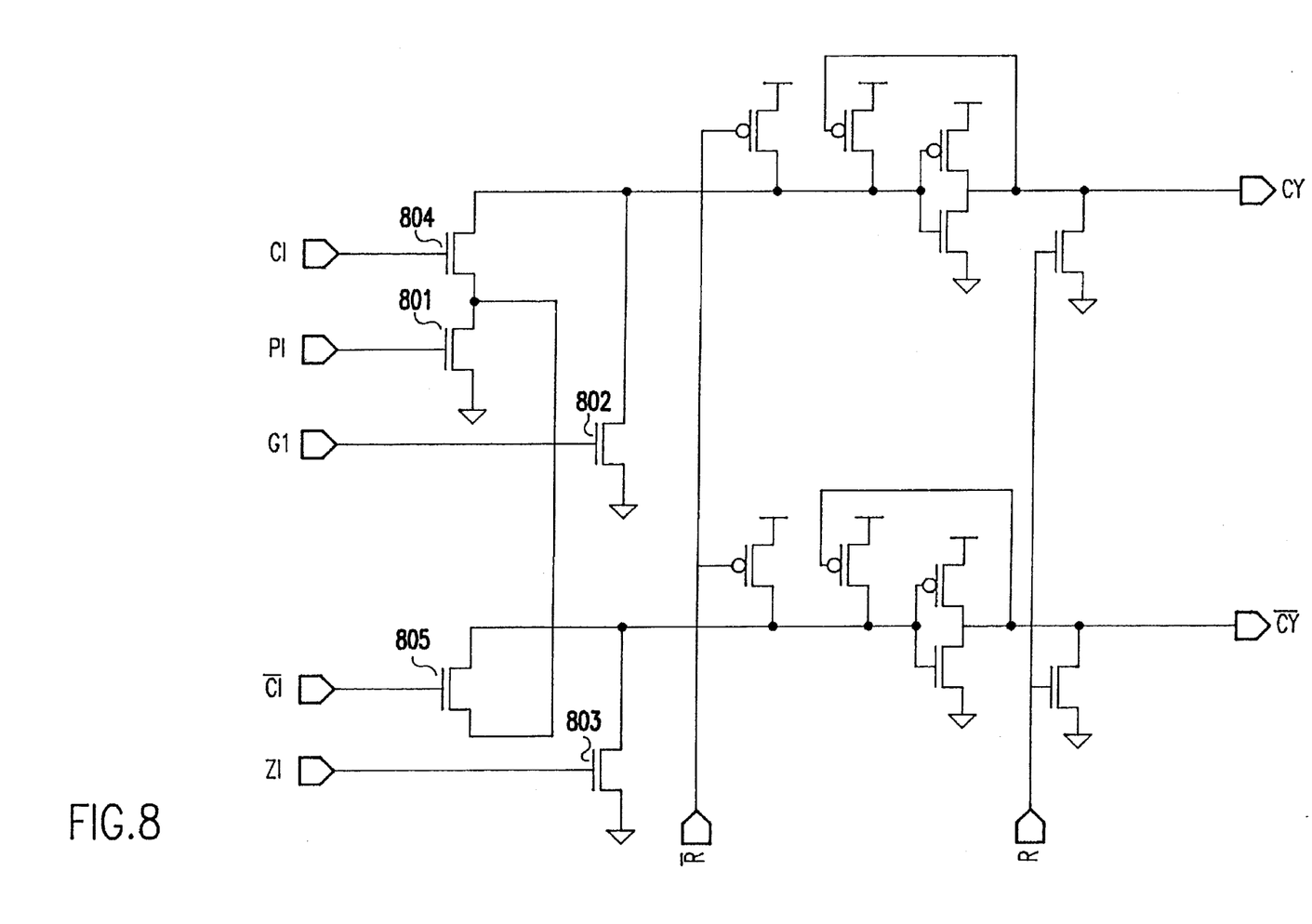
FIG. 8 is a schematic diagram of the carry merge (CMRG) circuit used in the adder of FIG. 1.

FIG. 8 is a schematic diagram of the carry merge circuit (CMRG) used in the adder of FIG. 1. The five inputs are PI, GI, ZI, CI, and $\overline{CI}$ are similar to the inputs described above. The two outputs are CY and $\overline{CY}$. Again, the right half of this circuit is provides the self-resetting function and will not be described further. Input PI is connected to the gate of n-channel device 801. Input GI is connected to the gate of n-channel device 802. Input ZI is connected to the gate of n-channel device 803. Input CI is connected to the gate of n-channel device 804. And input $\overline{CI}$ is connected to the gate of n-channel device 805. The drain of device 801 is connected to the sources of devices 804 and 805. The drains of devices 802 and 804 are connected to a common node, and the drains of devices 803 and 805 are connected to a common node. The common node to which the drains of devices 802 and 804 are connected is connected to a first output inverter which drives the output CY, and the common node to which the drains of devices 803 and 805 are connected is connected to a second output inverter which drives the output $\overline{CY}$. Thus, the output CY is generated according to the Boolean logic function $$CY = PI \cdot CI + GI,$$

and the output $\overline{CY}$ is generated according to the Boolean logic function $$\overline{CY} = PI \cdot \overline{CI} + ZI,$$

as set out in the table above.

Figure 9:
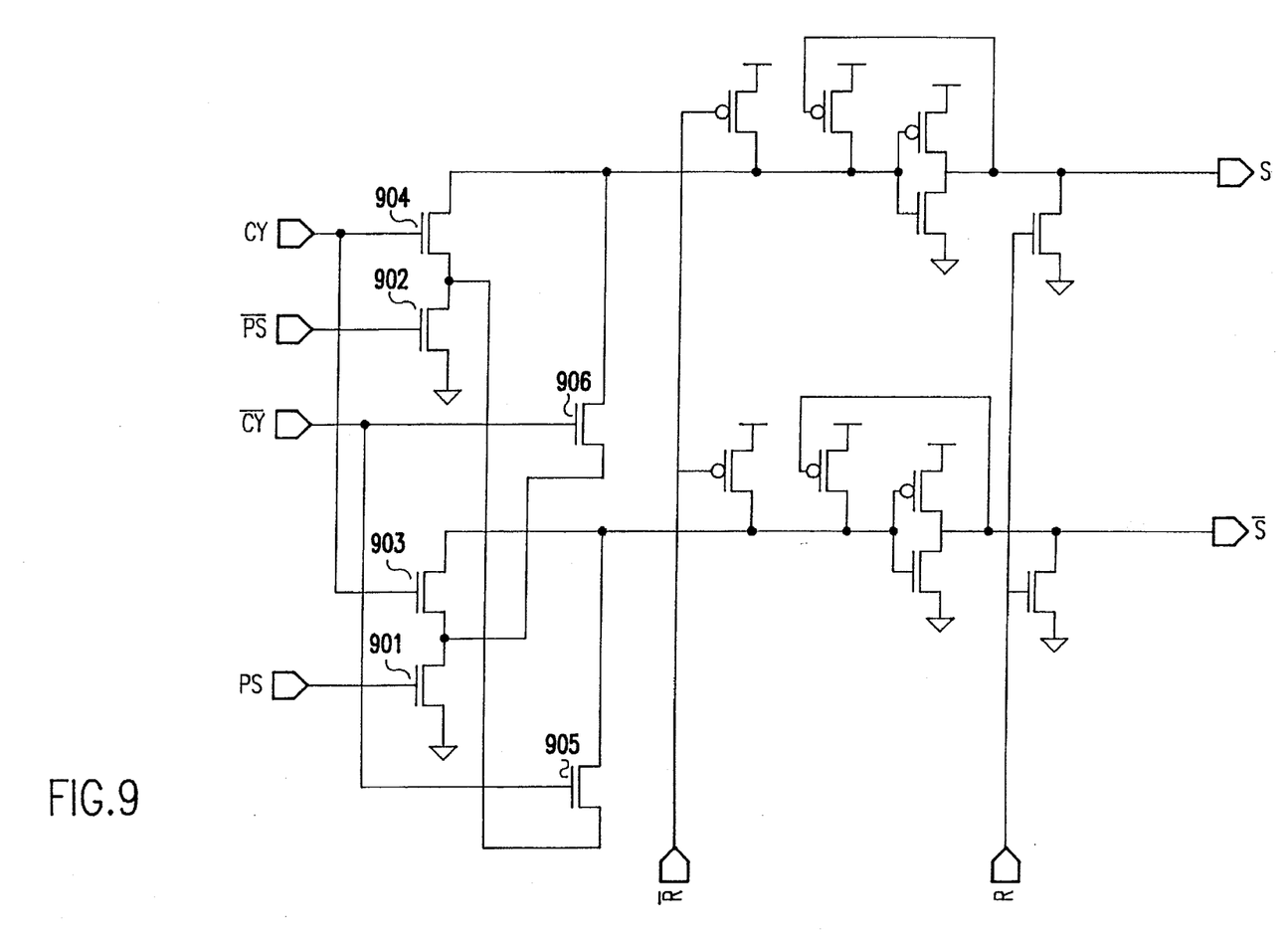
FIG. 9 is a schematic diagram of the full sum (FSUM) circuit used in the adder of FIG. 1.

FIG. 9 is a schematic diagram of the full sum circuit (FSUM) used in the adder of FIG. 1. The inputs are CY, $\overline{CY}$, PS, and $\overline{PS}$, and the sum outputs are S and $\overline{S}$. The inputs PS and $\overline{PS}$ denote the partial sum and its complement, respectively, and are connected to the gates of n-channel devices 901 and 902. The input CY is connected to the gates of n-channel devices 903 and 904, while the input $\overline{CY}$ is connected to the gates of n-channel devices 905 and 906. The drain of device 901 is connected to the sources of devices 903 and 906, and the drain of device 902 is connected to the sources of devices 904 and 905. The drains of devices 903 and 905 are connected to a common node, and the drains of devices 904 and 906 are connected to a common node. The node to which the drains of devices 903 and 905 are connected is connected to a first inverter which drives the output $\overline{S}$, and the node to which the drains of the devices 904 and 906 are connected is connected to a second inverter which drives the output S.

Figure 10:
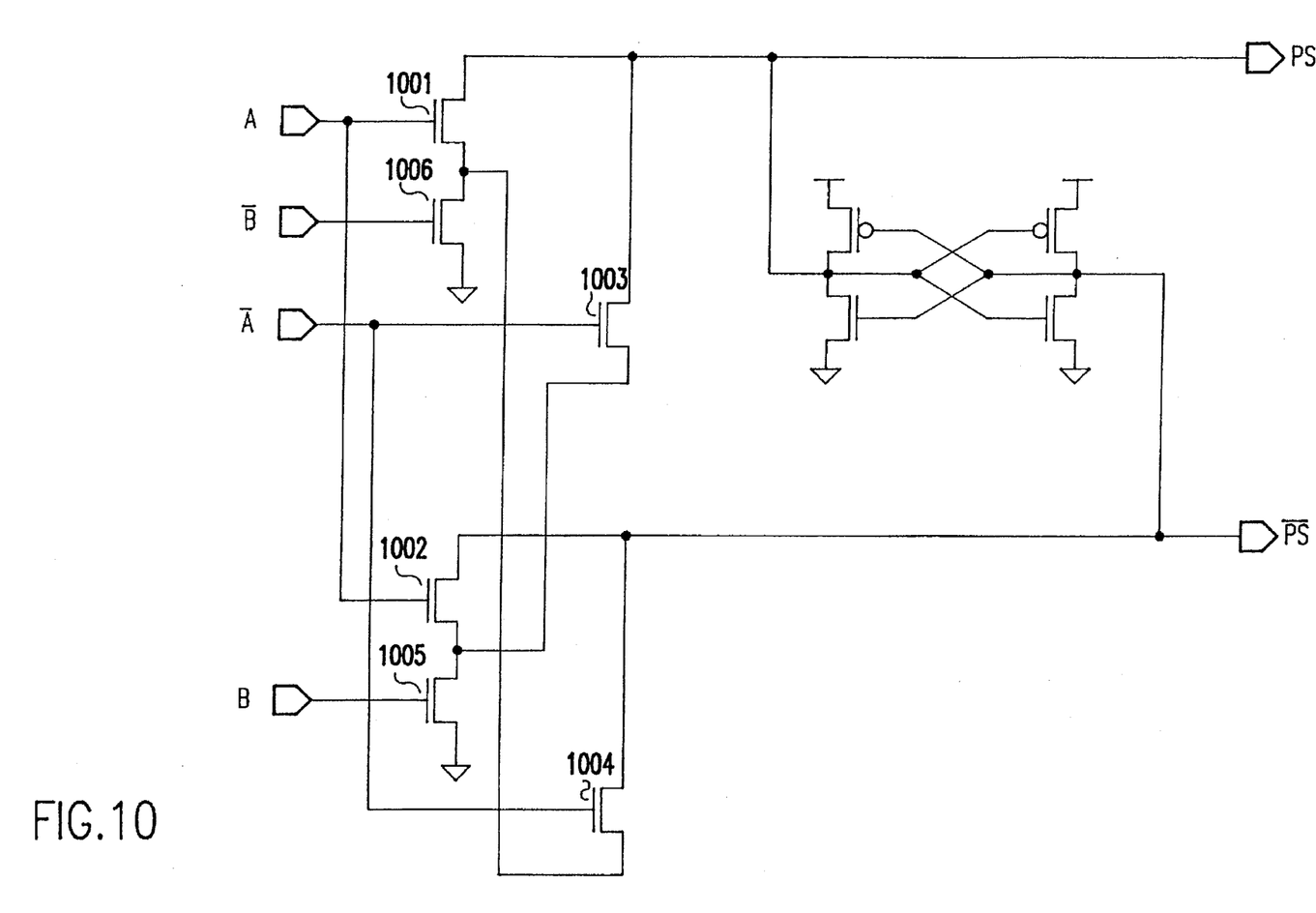
FIG. 10 is a schematic diagram of the partial sum (PSUM) circuit used in the adder of FIG. 1.

The partial-sum circuit (PSUM) used in the right-most column of the adder is shown in FIG. 10. The inputs are A, $\overline{A}$, B, and $\overline{B}$, and the outputs are PS and $\overline{PS}$. The input A is connected to the gates of n-channel devices 1001 and 1002, while the input $\overline{A}$ is connected to the gates of n-channel devices 1003 and 1004. The input B is connected to the gate of n-channel device 1005, while the input $\overline{B}$ is connected to the gate of n-channel device 1006. This circuit implements an exclusive-OR (XOR) function of the binary inputs as shown below:

$$PS = A\overline{B} + \overline{A}B$$

$$\overline{PS} = AB + \overline{AB}$$

The series connected n-channel devices 1001 and 1006 perform the logic function $A\overline{B}$, and the series connected n-channel devices 1003 and 1005 perform the logic function $\overline{A}B$. The common connection of the drains of devices 1001 and 1003 provide the logical OR function to generate the output PS. The series connected n-channel devices 1002 and 1005 perform the logical function AB, and the series connected n-channel devices 1004 and 1006 perform the logical function $\overline{AB}$. The common connection of the drains of devices 1002 and 1004 provide the logical OR function to generate the output $\overline{PS}$. The right half of this circuit shows the partial-sum outputs connected to a pair of cross-coupled inverters forming a flip-flop that holds the partial sum value after the input pulses are finished.

Figure 11:
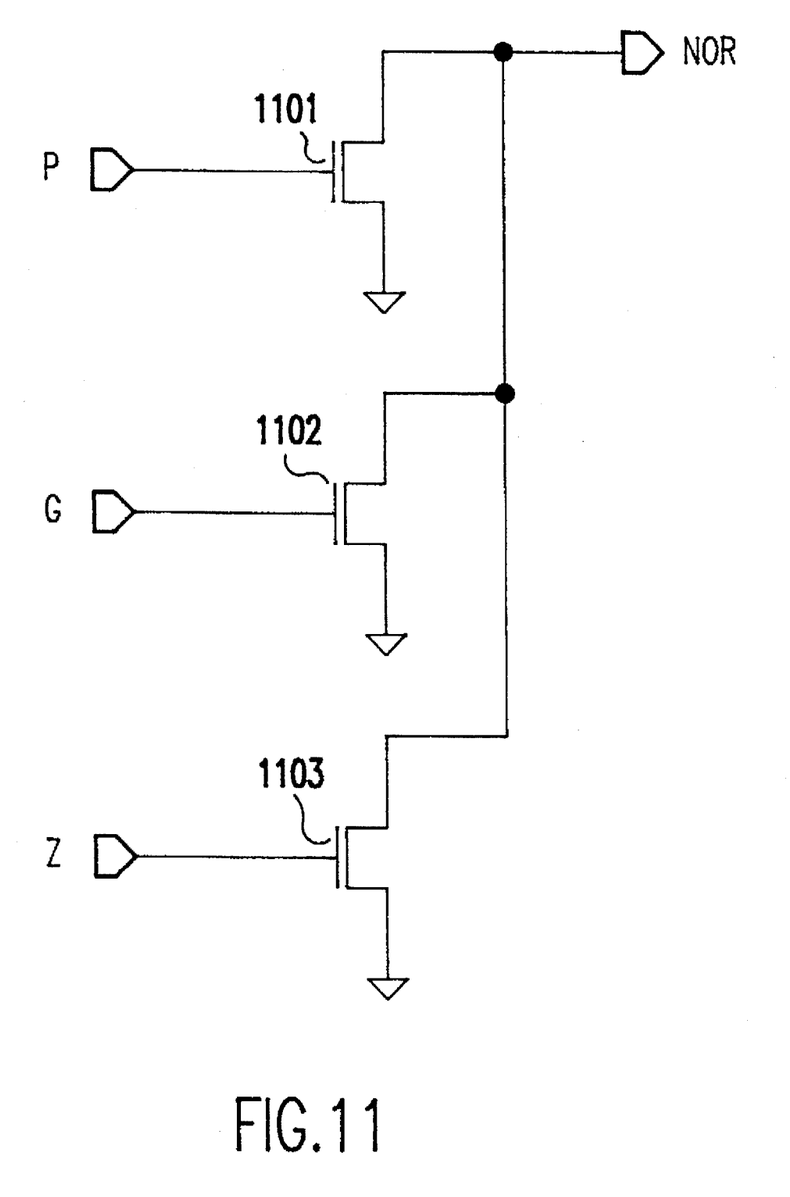
FIG. 11 is a schematic diagram of the three-input NOR circuit used in the adder of FIG. 1.
Figure 12:
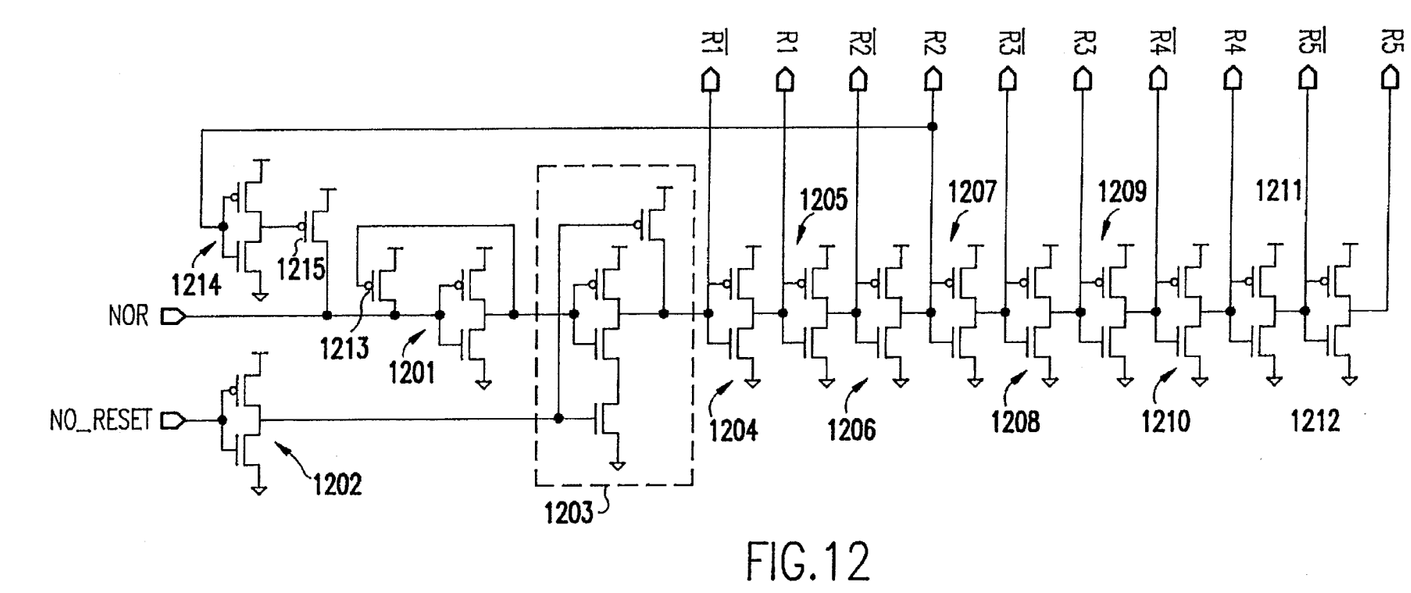
FIG. 12 is a schematic diagram of the reset timing chain (RTC) used in the adder of FIG. 1.

The self-reset portion of these circuit elements is supported by the NOR circuit shown in FIG. 11 and the reset timing chain (RTC) circuit shown in FIG. 12. The NOR circuit in FIG. 11 shows each input driving a separate n-channel device 1101, 1102 and 1103. When one of these inputs is activated, the NOR output will be driven low due to the conduction of that n-channel device. The adder in FIG. 1 shows a column of NOR circuits $108_1$ to $108_9$ with their inputs connected to the second column of evaluation circuits and all of their outputs connected together.

The RTC circuit in FIG. 12 receives as its inputs the output of the NOR circuits and a NO_RESET input, the latter of which is used for testing purposes. Both of these inputs are inverted by inverters 1201 and 1202, respectively, with the output of these inverters driving a two input NAND gate 1203. The output of the NAND gate produces the first reset signal called $\overline{R}_1$. This is followed by nine inverters 1204 to 1212 connected in series that sequentially produce the reset signals $R_1$, $\overline{R}_2$, $R_2$, $\overline{R}_3$, $R_3$, $\overline{R}_4$, $R_4$, $\overline{R}_5$, and $R_5$, respectively. Each pair of signals is used to reset a column of evaluation circuits in the adder as shown in FIG. 1. There are two feedback paths in the RTC circuit 107. The first path connects the output of the first inverter 1201 to a p-channel device 1213 connected to the inverter's input. This acts as a half-latch that holds the NOR output in its inactive (high) state. The second feedback path from the output of inverter 1206 has the $R_2$ reset signal feeding an inverter 1214 which drives a p-channel device 1215 also connected to the NOR output line. This path changes the NOR output signal from active (low) to inactive (high) after the second column of evaluation devices has reset.

To facilitate testing, the feedback loop formed by the self-resetting circuits can be broken. This is done by the NAND gate 1203 at the beginning of the reset timing chain which is controlled by an external signal called NO_RESET as shown in FIG. 12. More particularly, the NO_RESET input is connected to inverter 1202 which drives one input of the two input NAND gate 1203. The output of NAND gate 1203 is connected to the reset inverter chain, thus making the NAND gate part of the reset chain. When NO_RESET is low, the adder operates in its normal self-resetting mode. When NO_RESET is high, the adder will evaluate but not reset. Then when NO_RESET is brought low, the adder will reset. For testing purposes, this allows the evaluation and reset circuits to be exercised separately. This also allows the adder to be tested like conventional CMOS circuits.

The width of a data bubble as it moves through the adder is determined by the time required to loop through the self-resetting circuit elements. These elements consist of the logic blocks arranged in a columns, the NOR gates which monitor the output of the second column, and the reset timing chain (RTC) circuit block. When the logic blocks evaluate, they activate the NOR gates which in turn activates the RTC circuit to provide two complementary reset signals to each column of logic blocks. Once the logic blocks reset, the NOR gate resets as does the reset timing chain. The data bubble width is defined by period of time from the rising output of the logic blocks to the resetting of these blocks.

In the current CMOS (Complementary Metal Oxide Semiconductor) technology, the nominal delay of a 64-bit implementation of this adder is 900 ps. The high performance of the adder, according to the invention, is achieved by combining the advantages of a fully custom design methodology with the higher performance potential of self-resetting CMOS circuits. In addition, a novel logic scheme which calculates the carry propagate, carry generate, or zero carry for a two-way carry look-ahead function, reduces the merge circuit power by one half and the transistor count by 25% compared to a conventional CMOS adder implementation.

Four separate factors contribute to ensuring good operating margins for the self-resetting circuit blocks. First, the minimum output pulse width of each block in a column is designed to be three times that needed to fully switch the input to the block in the next column. Second, wherever pulses intersect (i.e., data bubbles coalesce), adequate margin is obtained, in the case two pulses from one column intersect at the next column, by providing relatively wider pulses and by equalizing the delay of blocks from preceding columns or, in the case where two pulses from widely separate columns intersect, by capturing the earlier arriving pulse with a latch. Third, standby devices are added to the circuits. These devices are large enough to overwhelm noise sources, but small enough to have a minimum impact on delay and output pulse width. And finally fourth, careful custom design is used to minimize all noise sources on signals and power supplies.

While the invention has been described in terms of a single preferred embodiment with examples of various modifications and alternatives, those skilled in the art will recognize that the invention can be practiced with modification within the spirit and scope of the appended claims.

Having thus described our invention, what we claim as new and desire to secure by Letters Patent is as follows:

1. A parallel binary adder comprising an array of complementary metal oxide semiconductor (CMOS) circuit blocks arranged in a plurality of columns of evaluation logic and a column of reset logic, a first column of said evaluation logic comprising a carry generator circuit (CGEN) and a plurality of propagate/generate/zero (PGZ) generator circuits (PGEN) circuits each receiving least significant bits (LSBs) and a carry input, intermediate columns of buffer and merge logic blocks connected to said CGEN and PGEN circuits, followed by a column of final sum (FSUM) circuits, and a final column of partial sum (PSUM) circuits, said PSUM circuits receiving said first and second binary inputs and providing partial sum signals to said FSUM circuits, said FSUM circuits outputting a binary result, said merge logic blocks calculating a carry out of a most significant bit (MSB), each of said CGEN, PGEN, merge and FSUM circuits comprising a self-resetting logic block including a logic tree connected to an output inverter, a half-latch connected to the output inverter and resetting devices connected to outputs of the logic tree and the output inverter and responsive to timed reset signals, said adder further comprising a reset timing chain connected to the row reset logic and generating said timed reset signals, the evaluation logic implementing an adder bubble pipelined circuit logic architecture in which a bubble pipeline segment consists of a column of self-resetting circuit blocks allowing a fast cycle time and minimum delay for each block by using fast forward amplification of a leading edge of pulsed input signals followed by quick self-resetting of all nodes back to a standby state.

2. The parallel binary adder recited in claim 1 wherein loading in a critical path of the adder is reduced by moving as many merge circuit blocks as possible to later columns allowing a fan-out per stage in the critical path to be reduced.

3. The parallel binary adder recited in claim 1 wherein the buffer circuits in the columns of evaluation logic maintain synchronization of pulses propagating in the adder bubble pipelined circuit logic architecture.

4. The parallel binary adder recited in claim 1 wherein said reset timing chain includes a gate controlled by a test signal that prevents the reset timing chain from generating said timed reset signals in order to test the adder.

5. The parallel binary adder recited in claim 1 wherein the CGEN circuit implements the Boolean functions $$CY=A \cdot B + A \cdot CI + B \cdot CI$$

and $$\overline{CY}=\bar{A} \cdot \bar{B} + \bar{A} \cdot \overline{CI} + \bar{B} \cdot \overline{CI},$$

where A and B are first and second binary inputs, CI is a carry input, CY is a carry output, and $\overline{A}$, $\overline{B}$, $\overline{CI}$, and $\overline{CY}$ are respectively the complements of A, B, CI and CY.

6. The parallel binary adder recited in claim 1 wherein said PGEN circuits calculate a propagate signal P, when only one binary input is a "1", a generate signal G, when both binary inputs are "1", or a zero signal Z, when both binary inputs are "0", for a 2-bit group of said first and second binary input signals.

7. The parallel binary adder recited in claim 6 wherein the PGEN circuit implements the Boolean functions $$P=A \cdot \bar{B} + \bar{A} \cdot B,$$

$$G=A \cdot B, \text{ and}$$

$$Z=\bar{A} \cdot \bar{B},$$

where A and B are first and second binary inputs and $\overline{A}$ and $\overline{B}$ are their complements.

8. The self-resetting parallel binary adder recited in claim 7 wherein said merge circuits include carry merge circuits (CMRG) and PGZ merge circuits (PMRG), said PMRG circuits combining two sets of orthogonal input signals coming from merge trees in a preceding column of the evaluation logic.

9. The self-resetting parallel binary adder recited in claim 8 wherein said CMRG circuits implement the Boolean functions $$CY=P \cdot CI+G, \text{ and}$$

$$\overline{CY}=P \cdot \overline{CI}+Z,$$

and where said PMRG circuits implement the Boolean functions $$P=P_0 \cdot P_1,$$

$$G=G_0 \cdot P_1+G_1, \text{ and}$$

$$Z=Z_0 \cdot P_1+Z_1,$$

where $P_1$, $G_1$ and $Z_1$ are input from a PGEN circuit in the same column, while the inputs $P_0$, $G_0$ and $Z_0$ are input from a PGEN circuit in the next preceding column.

10. The parallel binary adder recited in claim 9 wherein the FSUM circuits implement the Boolean functions $$S=PS \cdot \overline{CY}+\overline{PS} \cdot CY, \text{ and}$$

$$\bar{S}=PS \cdot CY+\overline{PS} \cdot \overline{CY},$$

where S is the final sum output, PS is the partial sum input, and $\overline{S}$ and $\overline{PS}$ are their respective complements.

11. The parallel binary adder recited in claim 10 wherein the PSUM circuits implement the Boolean functions $$PS=A \cdot \bar{B}+\bar{A} \cdot B, \text{ and}$$

$$\overline{PS}=A \cdot B+\bar{A} \cdot \bar{B}.$$

12. The parallel binary adder recited in claim 11 wherein the PSUM circuits include cross-coupled inverters forming latches set by a partial sum output, said latches being connected to inputs of corresponding ones of the FSUM circuits.

* * * * *